United States Patent [19]
Nasu

[11] Patent Number: 5,574,499
[45] Date of Patent: Nov. 12, 1996

[54] INTEGRATED CIRCUIT FOR TESTING A PLURALITY OF 1H MEMORIES

[75] Inventor: Miyuki Nasu, Tokyo, Japan

[73] Assignee: NEC Corporation, Japan

[21] Appl. No.: 239,023

[22] Filed: May 6, 1994

[30] Foreign Application Priority Data

May 10, 1993 [JP] Japan .................................. 5-107804

[51] Int. Cl.⁶ .................................................. H04N 17/00
[52] U.S. Cl. ............................................. 348/180; 348/714
[58] Field of Search ..................................... 348/180, 497, 348/714, 181, 571; 360/36.1, 36.2; 73/865.9; H04N 17/00, 17/02, 9/64

[56] References Cited

FOREIGN PATENT DOCUMENTS

| 0525899 | 2/1993 | Germany | H04N 17/00 |
| 4281691 | 10/1992 | Japan | H04N 17/00 |
| 536299 | 2/1993 | Japan | G11C 29/00 |

*Primary Examiner*—Safet Metjahic
*Attorney, Agent, or Firm*—Ostrolenk, Faber, Gerb & Soffen, LLP

[57] ABSTRACT

An IC for processing video signals includes a test signal generator for producing a test signal PT synchronized with a horizontal synchronizing signal HS, a distributor responsive to the test signal PT for supplying, at points of time t2, t3, and t4, 1H memories with associated test signals PTA, PTB, and PTC each having the same duration time T2 and number of pulses as those of the test signal PT, a counter for obtaining the duration time T2 and the number of pulses for each of the test signals PTA, PTB, and PTC, a counter for generating the duration time T2 and the number of pulses for each of delayed test signals PHA, PHB, and PHC, and a collating circuit for achieving collating between the values obtained from the counters.

8 Claims, 5 Drawing Sheets

INTEGRATED CIRCUIT FOR TESTING A PLURALITY OF 1H MEMORIES

BACKGROUND OF THE INVENTION

The present invention relates to an integrated circuit (IC) for processing video signals, and in particular, to an integrated circuit for processing video signals having means (memories) for providing a 1 H delay (i.e., a delay of one horizontal scanning period) and a function to test the 1 H delay means.

DESCRIPTION OF THE PRIOR ART

In various fields related to video apparatuses such as television (TV) facilities and video cassette recorders (VTRs), there have been recently adopted the digital signal processing technology employing a 1 H memory delaying a digitized video signal by one horizontal scanning period to suppress, for example, a noise and jitter and thereby to remove a ghost. In association with above requirements in the market, thanks to recent developments in the digital signal processing technology and the integrated circuit fabricating technology, there have been implemented various video signal processing ICs in which the 1 H memory and the other video signal processing circuits are mounted in an identical substrate.

FIG. 1 shows in a block diagram the constitution of a first example of a general IC for processing video signals in accordance with the conventional technology. In the first example, there are included an input circuit 11 as an input interface for receiving an input video signal VI to produce a video signal V corresponding thereto, a clock generator circuit 12 for receiving a clock signal CK to create a clock pulse signal CC to be fed to the input circuit 11 and a video processing section 16 for receiving the video signal V to accomplish a predetermined video processing for the video signal V so as to produce a video signal VA, and an output circuit 14 as an interface for receiving the video signal VA to generate an output signal VO associated therewith.

The processing section 16 includes a pre-processing section 131 for achieving a pre-processing for the video signal V to produce a resultant signal VF, a 1 H memory 132 for delaying the signal VF by a 1 H period to produce a delayed signal VH, a post-processing section 133 for effecting a post-processing for the obtained signal VH to create a resultant signal VF, and switches S161 to S164 operative in response to a test mode signal T.

In operation, the signal T is inactive in an ordinary operation and each of switches S161 to S164 is set to an associated contact point B. Receiving the clock signal CK from an external circuit, the clock generator 12 generates and supplies the clock pulse signal CC to the internal circuits. The input circuit 11 supplies, when the input video signal VI and the clock pulse CC are received, an associated video signal as the signal V synchronized with the clock CC via the switch 161 to the pre-processing circuit 131. In response thereto, the circuit 131 conducts the pre-processing for the video signal V and then delivers the resultant signal VF of the processing via the switch 162 to the 1 H memory 132. The memory 132 delays the signal VF by the 1 H period and then feeds the signal VH via the switch S163 to the post-processing circuit 133. Executing the post-processing for the signal VH, the circuit 133 sends an obtained signal VA via the switch 164 to the output circuit 14. On receiving the signal VA and the clock signal CC, the output circuit 14 produces therefrom an output signal VO synchronized with the clock signal CC.

Next, in a test of the memory 132, the test mode signal T is set to be active and the switches S161 to S164 select contact points A, respectively. In addition, a patterned test signal VT is supplied from an external circuit to the input circuit 11. The circuit 11 transmits a signal TS corresponding to the test signal VT via the switches S161 and S162 directly to the 1 H memory 132. Moreover, a 1 H delay test signal TH from memory 132 is fed via the switches 163 and S164 directly to the output circuit 14. The signal TH is then outputted as a signal TO from the circuit 14. On the other hand, the test signal VT is delayed by a 1 H period through an external delay circuit, not shown, thereby producing a reference signal. Whether or not the 1 H memory 132 is normal is decided by collating the output signal TO with the reference signal at an external.

The first example of the video signal processing IC is attended with a drawback that there are necessitated for the 1 H memory test a test signal generator for beforehand externally creating the test signal VT, the delay circuit for generating the reference signal by delaying the test signal VT by the 1 H period and the collating circuit for thereby achieving the signal collation.

To improve the drawback, there have been proposed ICs for processing video signals. For example, FIG. 2 shows in a block diagram the configuration of a second example of the video signal processing IC described in the Japanese Patent Application Ser. No. 3-214317. This apparatus includes, in addition to an input circuit 11, a clock generator circuit 12, and an output circuit 14 similar to those shown in the first example of the prior art (FIG. 1), a video processing section 13 in place of the video processing section 16 and a test circuit 17 operative in response to a test mode signal T.

The video processing section 13 includes a pre-processing circuit 131, a 1 H memory 132, a post-processing circuit 133, and test switches S131 and 8132 operative in response to the test mode signal T. These constituent elements are respectively similar to those of the video processing section 16 of FIG. 1.

The test circuit 17 includes a test signal generating circuit 171 for creating a test signal PT including a plurality of pulses formed in a pattern during a preset period of time T2 from a point of time T1 delayed by a preset period of time T1a relative to a falling edge t0 of a horizontal synchronizing signal HS, a counter 172 for counting the numbers of pulses related to the test signal PT in the periods of time T1a and T2 and outputting the counted values CR and CP therefrom, a counter 173 for receiving a delayed test signal PH from the 1 H memory 132, counting the numbers of pulses in a period of time T1b equal to the period of time T1a and in the period of time T2, and for outputting the obtained values CH and CQ therefrom, and a collating circuit 174 for collating the values CR and CP respectively with the values CH and CQ and producing a monitor signal M therefrom. For simplification of description, the test signal PT and the delayed test signal PH are analog signals. However, these signals PT and PH may be digitized signals in an actual system.

Operation of the apparatus will be described by reference to the configuration of FIG. 2 and the signal timing chart of FIG. 3. First, the test mode signal T is inactive, namely, in an L level in an ordinary operation and the switches S131 and S132 (corresponding to the switches S161 to S164 in the case of FIG. 1) are set to respective contact points A. In this stage, the other operations are almost identical to those of the first example.

Subsequently, when testing the 1 H memory 132, the test mode signal T is active, namely, in an H level and the switches S131 and S132 are set to respective contact points B, thereby immediately activating the test circuit 17. The circuit 171 starts sending a test signal PT at a point of time t1a after the predetermined period of time T1a relative to the falling edge t0a of the horizontal synchronizing signal Hs via the switch 131 to the 1 H memory 132 and the counter 172. The counter 172 is reset at the end of the period of time t1a. Namely, in the period of time T1a from t0a to t1a, the counter 172 counts the number of signals according to the clock signal CC and produces the value GR. Moreover, the counter 172 counts the number of pulses in the period of time T2 to obtain the value CP. On the other hand, the 1 H delayed test signal PH is fed from the 1 H memory 132 via the switch S132 to the counter 173, which is reset at a falling edge t0b of the signal HS after one 1 H period relative to the time t0a. Namely, in the period of time T1b from t0b to t1b or to a leading edge of the delay signal PH, the counter 173 counts the number of signals to obtain the value CH. Moreover, the counter 173 counts the pulses of the signal PH in the period of time T2 to produce the value CQ. In the collating circuit 174, the values CR and CP are collated respectively with the values CH and CQ in collation steps for T1 and T2, respectively. When the collation for T1 results in matching, it is indicated that the values CR and CH are identical to each other and hence the periods of time T1a and T1b respectively associated therewith are equal to each other. Moreover, a matching result from the collation for T2 denotes that the numbers of pulses respectively associated with the values CP and CQ are identical to each other. When each of the collation steps for T1 and T2 results in matching, the 1o function of the tested 1 H memory 132 is assumed to be normal and hence a "normal" signal is produced as a monitor output signal M. When a mismatching condition results from both or either one thereof, the function of the 1 H memory 132 is regarded abnormal, thereby outputting an "error" signal as the monitor output signal M.

The first example of the video signal processing IC is attended with a drawback. Namely, to test the 1 H memory, there are necessitated a test signal generator for beforehand externally creating a test signal VT, a delay circuit for generating the reference signal by delaying the test signal VT by a 1 H period and a collation circuit for thereby achieving the signal collation.

In addition, the second example of the IC removing the above drawback has a disadvantage that in a case where a plurality of 1 H memories are disposed in the IC, when the memories are individually examined by one test circuit, the overall test time is increased in proportion to the number of the memories.

SUMMARY OF THE INVENTION

The video signal processing IC in accordance with the present invention includes a first memory and a second memory each for delaying a digital video signal by one horizontal scanning period, a test circuit achieving a test of each of the first and second memories, and switching means operative in the test of each of the first and second memories for connecting an input and an output of each thereof the test circuit. The test circuit includes test signal generating means operative at a timing synchronized with a horizontal synchronizing signal of the digital video signal for producing an original test signal in a predetermined format represented by a series of a preset number of pulses in a predetermined duration period of time, test signal distributor means operative in response to the original test signal supplied from the test signal generator means for generating a first test signal and a second test signal in a format substantially identical to that of the original test signal, the first and second test signals being respectively associated with the first and second memories and being produced respectively at a predetermined first point of time and at a predetermined second point of time predetermined in the one horizontal scanning period, and collating means for collating the first test and second test signals respectively with a first delayed test signal and a second delayed test signal respectively created from the first and second memories in response to the first and second test signals respectively supplied thereto, thereby deciding matching states the first test signal and the first delayed test signal and between the second test signal and the second delayed test signal.

Other features and advantages of the present invention will become apparent from the following description of the invention which refers to the accompanying drawings.

DESCRIPTION OF THE PREFERRED EMBODIMENTS

Figure 1:
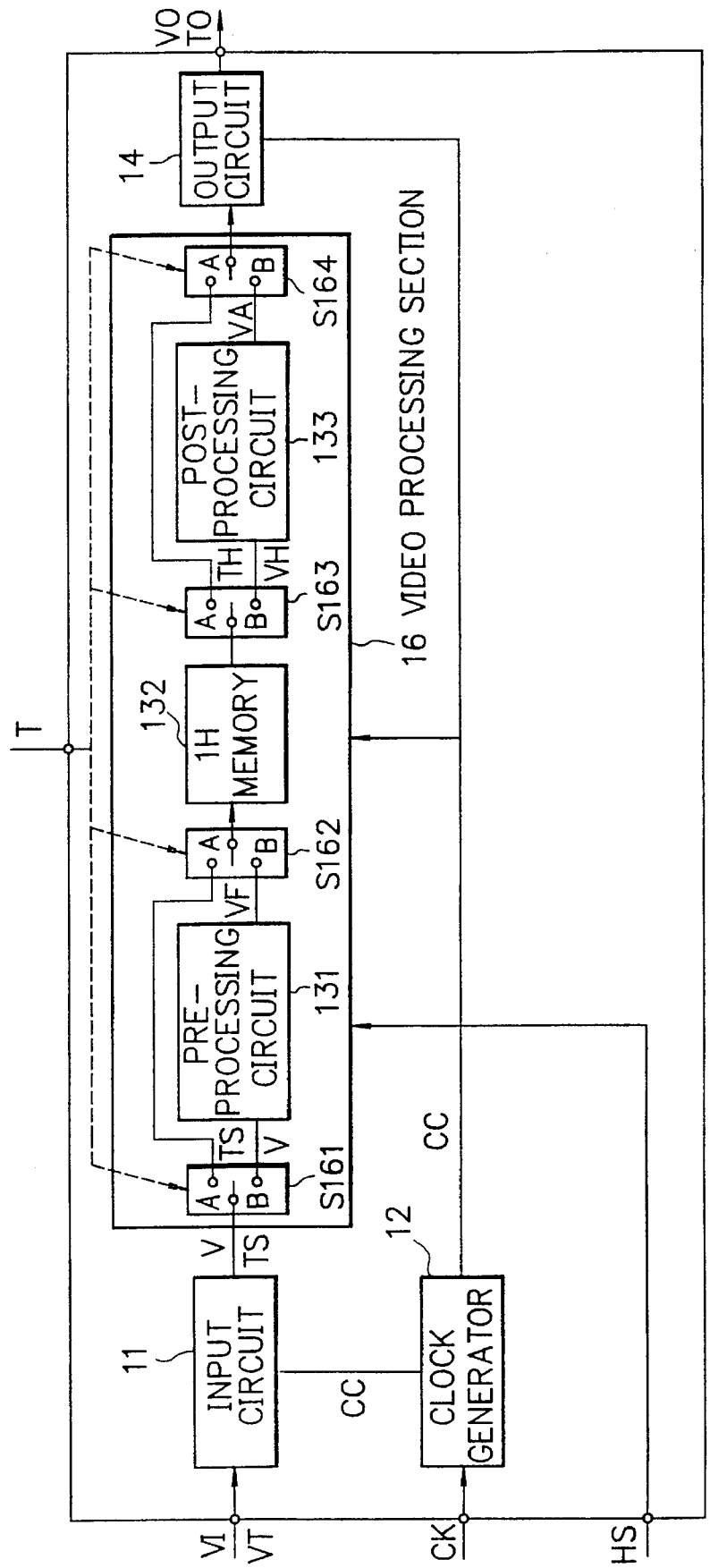
FIG. 1 shows in block diagram an example of a general IC for processing video signals in accordance with the prior art.
Figure 2:
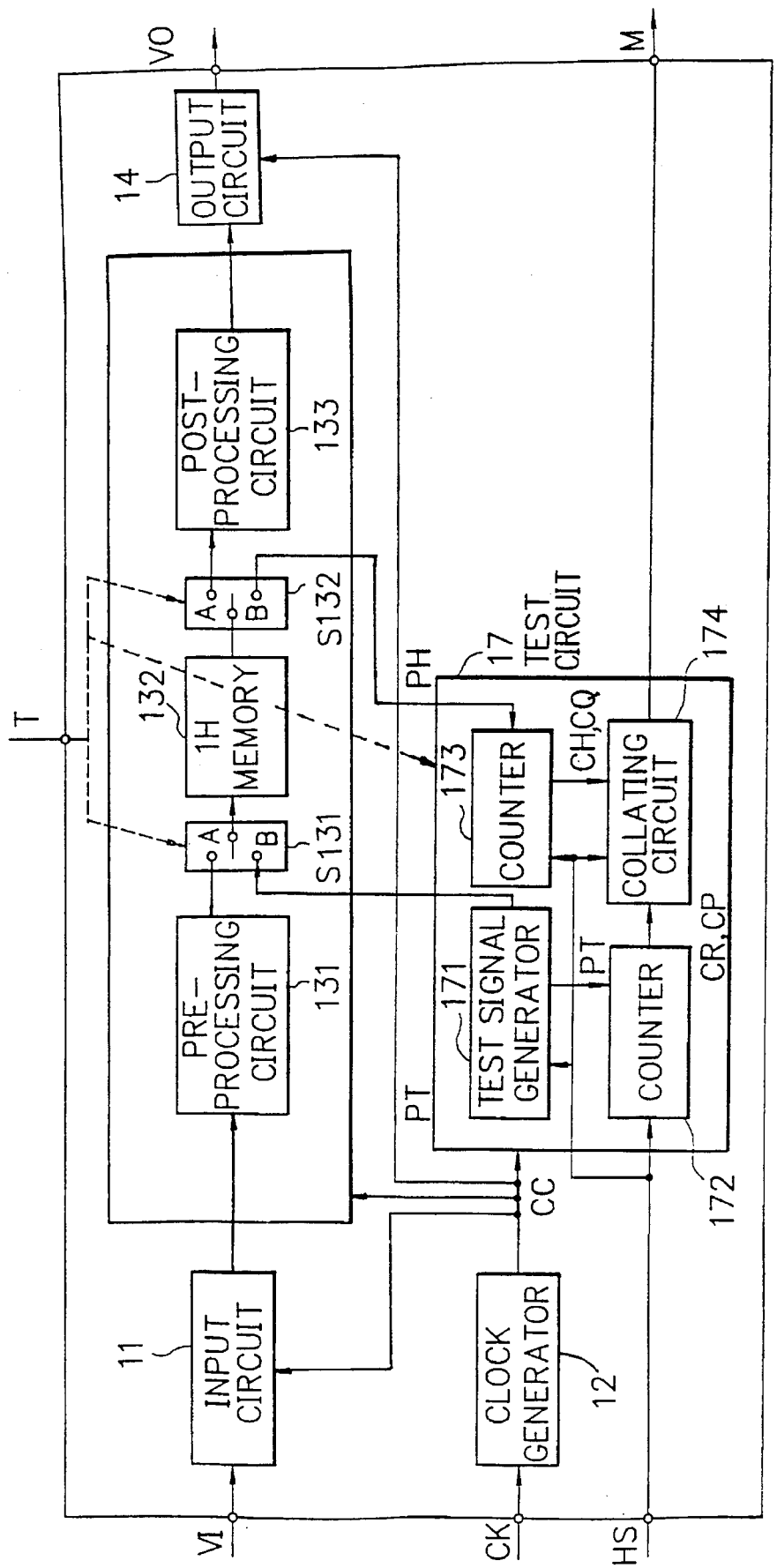
FIG. 2 shows in block diagram another example of a prior art video signal processing IC.
Figure 3:
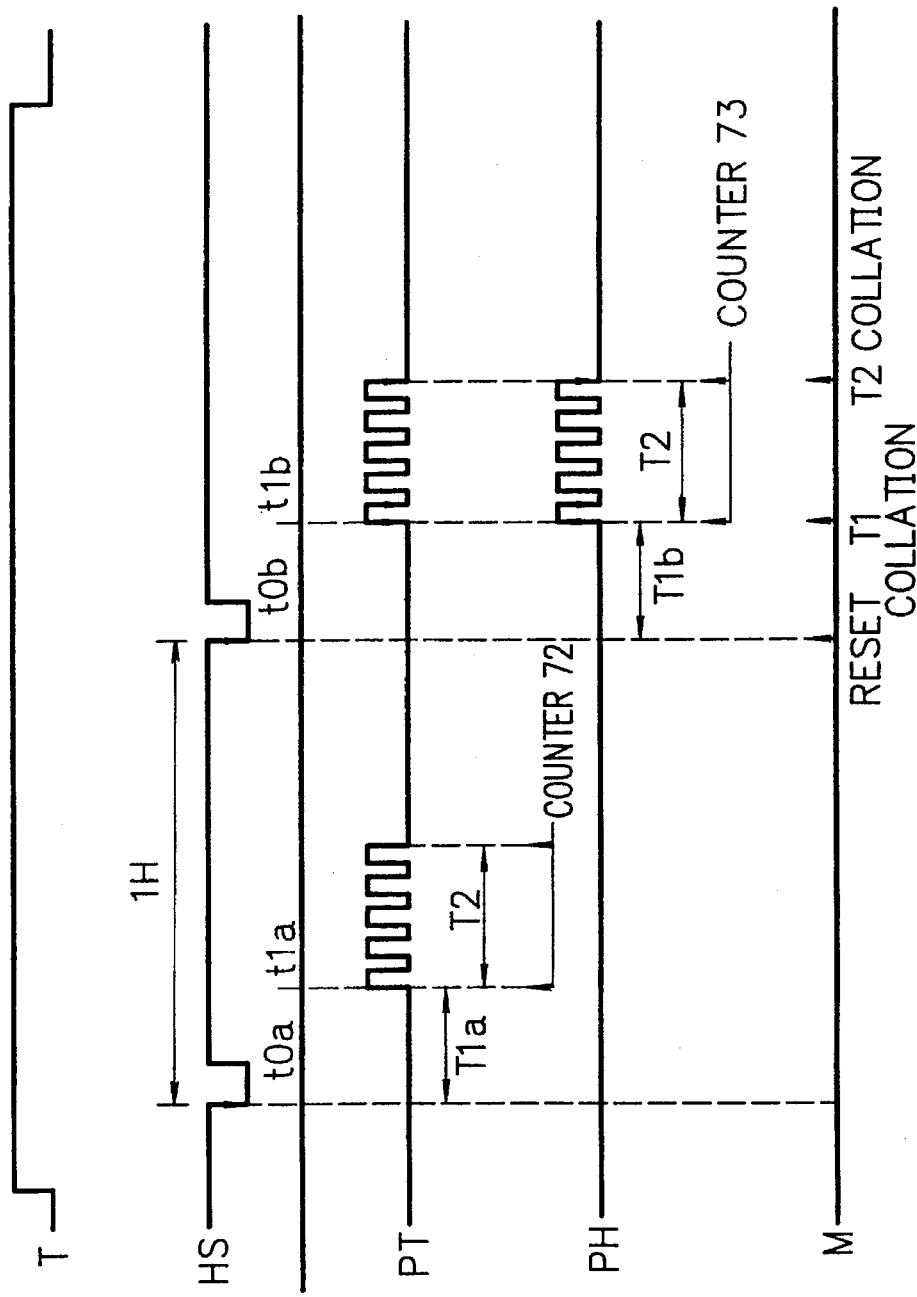
FIG. 3 shows a signal timing chart for describing the operation of the video signal processing IC of FIG. 2.

Referring now to the drawings, description will be given of an embodiment in accordance with the present invention.

Figure 4:
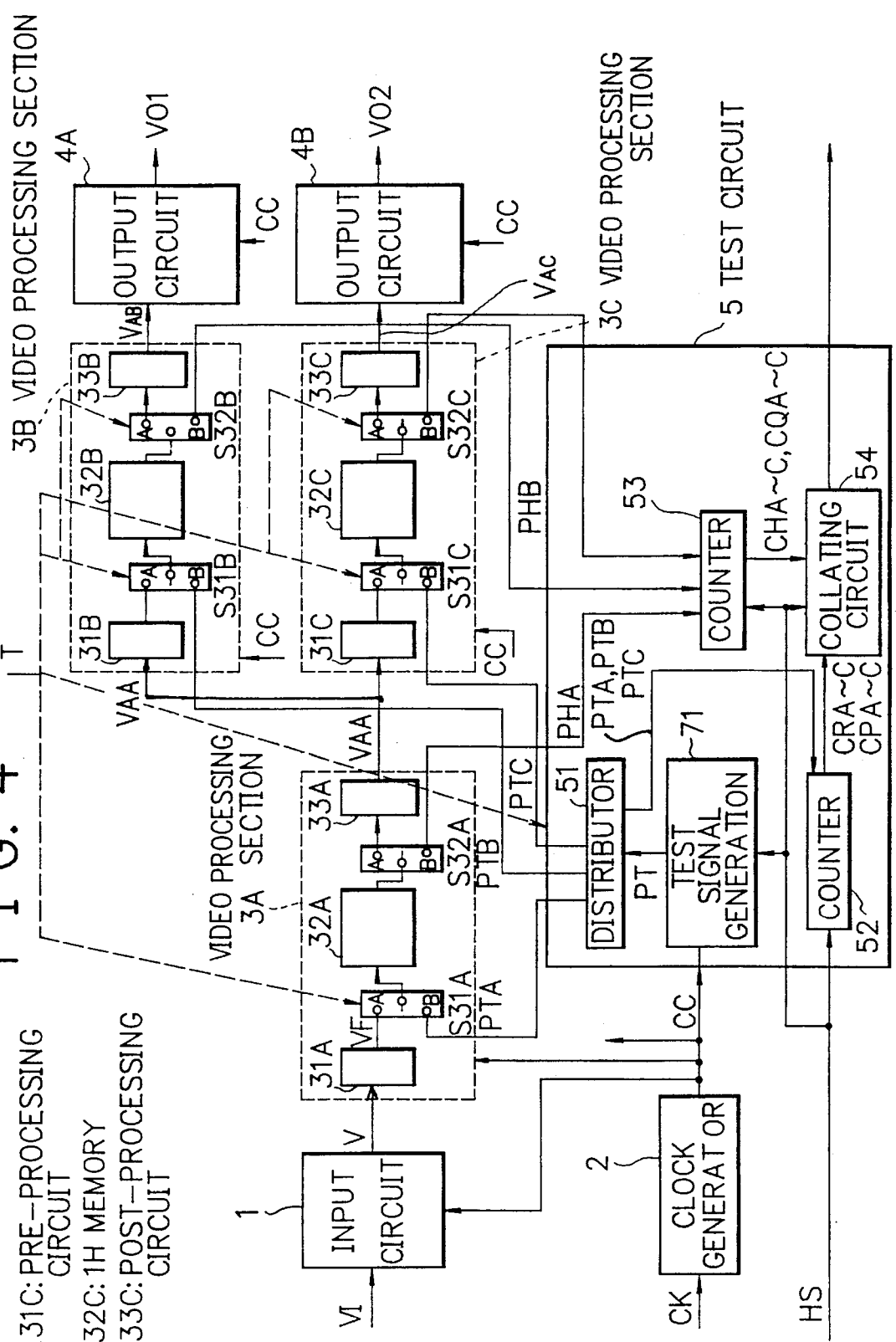
FIG. 4 shows in block diagram a video signal processing IC in accordance with the present invention.

FIG. 4 shows the configuration of a video signal processing IC in an embodiment in accordance with the present invention. The circuit includes an input circuit 1 for receiving an input video signal VI to produce a video signal V related thereto, a clock generator circuit 2 for receiving a clock signal CK to create a clock pulse signal CC, video processing sections 3A to 3C connected to the input circuit 1, output circuits 4A and 4B respectively connected to the sections 3B and 3C to respectively generate output signals VO1 and VO2 associated with the input video signal, and a test circuit 5 having a test signal distributing function to deliver test signals to the processing sections 3A to 3C.

The video signal processing section 3A includes a 31B pre-processing circuit 31A for conducting a pre-processing for the video signal V to create a signal VF, a 1 H memory for delaying the signal VF input thereto via a switch S31A by a 1 H period to generate a signal VH, and a post-processing circuit 38A connected via a switch S31B to the 1 H memory 32A for achieving a post-processing for the received signal VH to produce a signal VAA. The processing sections 3B and 3C are each linked with the processing section 3A and respectively include pre-processing circuits 31B and 31C for conducting a pre-processing for the received signal VAA, 1 H memories 82B and 32C respectively connected via switches S31B and S31C to the pre-processing circuits and 31C for delaying a received signal by a 1 H period to create a delayed signal, and post-processing circuits 33B and 33C respectively connected via switches S32B and S32C to the 1 H memories 32B and 32C for accomplishing a post-processing for a received signal to respectively produce output signals VAB and VAC. In this regard, constituent elements respectively assigned letters A to C are related to the processing sections 3A to 3C, respectively.

In FIG. 4, the video signal V outputted from the input circuit 1 is fed to the pre-processing circuit 31A of the section 3A, whereas the signal VAA from the post-processing circuit 33A of the section 3A is delivered to the pre-processing circuits 31B and 31C. The signals VAB and VAC respectively from the post-processing circuits 33B and 33C are respectively supplied to the output circuits 4A and 4B, thereby respectively producing therefrom the output signals VO1 and V02.

The test circuit 5 includes a test signal generating circuit 71 for generating a test signal PT including a plurality of pulses in a pattern during a preset period of time T2 from a point of time t1 afte a preset period of time T1a relative to a falling edge t0a of the horizontal synchronizing signal HS. The test circuit 5 further includes a distributor circuit 51 for distributing in a time sharing manner the test signal PT from the generator 71 as test signals PTA, PTB, and PTC respectively to the video processing sections 3A to 3C, a counter 52 for measuring the periods of time associated with the test signals PTA to PTC and counting the numbers of pulses related to the test signals PTA to PTC in the duration period T2 of the test signal PT to obtain counted values CRA, CRB, and CRC and CPA, CPB, and CPC, a counter 53 for measuring, like the counter 52, the periods of time of 1 H delayed test signals PHA to PHC and counting the numbers of pulses related to the test signals PHA to PHC in the duration period T2 to obtain counted values CHA, CHB and CHC, and CQA, CQB and CQC, and a collating circuit 54 for collating the values CRA, CRB, and CRC and CPA, CPB, and CPC respectively with the values CHA, CHB and CHC, and CQA, CQB and CQC, thereby determining the matching conditions respectively therebetween. In this connection, like in the description of the conventional example, for simplification of description. The test signals PT, PTA, PTB, and PTC as well as the delayed test signals PHA, PHB, and PHC are analog signals in the description. However, these signals may be actually digitized signals.

Figure 5:
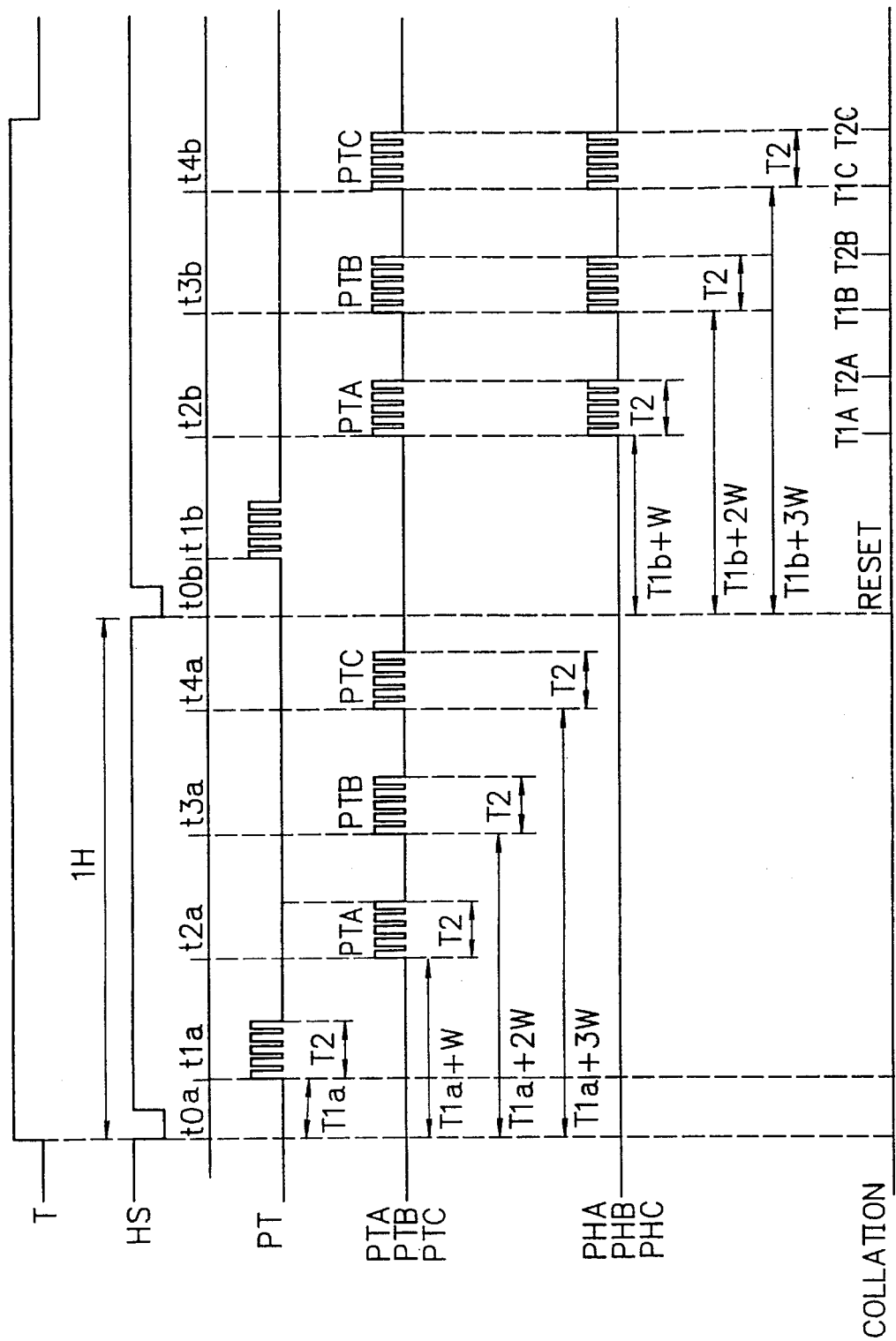
FIG. 5 shows a signal timing chart for describing the operation of the video signal processing IC of FIG. 4.

Operation of the system will be described by reference to the construction of FIG. 4 and a signal timing chart of FIG. 5. First, in the ordinary operation state, the test mode signal T is inactive, namely, at an "L" level and the switches S31A, S32A, S31B, S32B, S31C and S32C are set to the respective contact points A. Since operations of the video processing circuits are substantially identical to those of the second conventional example, only the operations directly related to the present invention will be described.

Next, when testing the 1 H memories 32A to 32C, the test mode signal T becomes active, namely, are set to an "H" level and the switches S31A, S32A, S31B, S32B, S31C and S32C are set to the respective contact points B, thereby immediately invoking the test circuit 5. The test signal generator 71 supplies the distributor circuit 51 with a test signal PT generated when a preset period of time T1a is elapsed from a falling edge t0a of the horizontal synchronizing signal HS. The distributor 51 delays the test signal PT by W, 2 W, and 3 W, the period W being slightly longer than the duration period T2 of the test signal PT. Resultantly, at delayed points of time t2a, t3a, and t4a respectively associated with delays T1a+W, T1a+2 W, and T1a +3 W, there are generated test signals PTA, PTB, and PTC related to the 1 H memories 32A, 32B, and 32C, respectively. The distributing circuit 51 sends the test signals PTA, PTB and PTC respectively via the switches S31A to S31C to the memories 32A to 32C and sequentially delivers the signals to the counter 52. The distributor 51 can be configured, for example, with a cascade connection including a shift register associated with a point of time t1a and with a delay time W and two stages of shift registers respectively associate with points of time t3a and t4a and with the delay time W. These shift registers are reset by the horizontal sychronizing signal HS and undergoes a shift control according to the clock signal CC related to each pixel of the video signal V. The technology of this kind has been well known and hence will not be described in detail.

Receiving the clock signal CC and the synchronizing signal H, the counter 52 is reset at the point of time t0a to measure according to the clock signal CC the periods between t0a and t2a to t4a, namely, t1a+W, t1a+2 W, and t1a+3 W to obtain the respective values CRA, CRB, and CRC. At the same time, the counter 52 counts the number of pulses for each of the test signals PTA, PTB and PTC during the period T2, thereby resultantly creating the values CPA, CPB, and CPC related to the respective signals. The circuit to develop the function of the counter 52 can be implemented as a combination of known circuits including synchronous binary counters, logical gates, and buffer registers temporarily storing therein counted values.

On the other hand, the 1 H delayed test signals PHA, PHB, and PHC respectively from the 1 H memories 32A, 32B, and 32C are sent respectively via the switches 332A, 832B, and S32C to the counter 53. The counter 53 is reset at a falling edge t0b of the horizontal synchronizing signal HS to measure periods of time therefrom to points of time t2b, t3b, and t4b, namely, T1b+W, T1b+2 W, and T1b+3 W, thereby generating associated values CHA, CHB, and CHC. Moreover, the counter 53 counts the numbers of constituent pulses respectively of the delayed test signals PHA, PHB, and PHC during the duration period T2 so as to output therefrom the values CQA, CQB, and CQC. The values CRA, CRB, and CRC and CPA, CPB, and CPC are respectively collated with the CHA, CHB, and CHC and CQA, CQB, and CQC through collation steps T1A, T1B, and T1C and T2A, T2B, and T2C respectively associated therewith in the collating circuit 54. When a matching results from the T1A collation, the periods of time T1a+W and T1b+W respectively related to the values CRA and CHA are equal to each other. In addition, a matching condition resultant from the T2A indicates the numbers of pulses respectively associated with the values CPA and CQA are identical to each other. When the steps T1A and T2A result in matching, the tested 1 H memory 32A is assumed to be normal. Similarly, when matching results from the collation steps T1B and T2B, the values T1a+2 W and T1b+2 W and CPB and CQB are respectively equal to each other. When the collation steps T1C and T2C result in matching states, the values T1a+3 W and T1b+3 W and CPC and CQC are respectively identical to each other. These results respectively indicate normality of the tested 1 H memories 32B and 32C. When each of the collation steps T1A, T1B, T1C, T2A, T2B, and T2C results in matching, a "normal" signal is generated as the monitor output signal M. Furthermore, when a mismatching condition occurs in either one of the steps above, it is assumed that at least one of the memories 32A to 32C is abnormal and hence an "error" signal is produced as the monitor output signal M.

The function of the collating circuit 54 of this kind can be configured by a combination of such known circuits as logical circuits including exclusive-OR circuits and buffering registers. b7

Accordingly, it is possible to simultaneously test the functions of the plural 1 H memories of the integrated circuit without using the test circuit disposed at a position external with respect to or in a peripheral of the integrated circuit. In addition, any failed 1 H memory can be easily identified.

As described above, the integrated circuit for processing video signals in accordance with the present invention includes a test signal generator for creating an original test signal synchronized with a horizontal scanning signal, a test signal distributor operative in response to the original test signal for generating a first test signal and a second test signal in a format substantially identical to that of the original test signal, the first and second test signals being respectively associated with a first memory and a second memory and being produced respectively at a predetermined first point of time and at a predetermined second point of time predetermined in the one horizontal scanning period, and a collating circuit for collating the first test and second test signals respectively with a first delayed test signal and a second delayed test signal respectively associated with the first and second test signals, thereby deciding matching states respectively therebetween. In consequence, there is obtained an advantage that the plural 1 H memories of the integrated circuit can be simultaneously tested without using any external circuit. Moreover, there is attained an advantageous feature that identification of any abnormal 1 H memory can be easily achieved.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. An integrated circuit for processing video signals by one horizontal scanning period;

a test means for achieving a test of each of a plurality of memory means; and a plurality of input switching means wherein each input switching means is connected to an input of said memory means and a plurality of output switching means wherein each output switching means is connected to an output of said memory means;

wherein the test means includes:

test signal generating means operative at a timing synchronized with a horizontal synchronizing signal of a digital video signal for producing an original test signal in a predetermined format represented by a series of a preset number of pulses in a predetermined duration period of time;

test signal distributor means operative in response to the original test signal supplied from the test signal generator means for generating a plurality of test signals in a format substantially identical to that of the original test signal, the plurality of the test signals being respectively associated with the plurality of the memory means and being produced respectively at a predetermined first point of time and at a predetermined second point of time in the one horizontal scanning period; and collating means for collating the plurality of the test signals respectively with delayed test signals respectively created from the plurality of the memory means in response to the test signals respectively supplied thereto, thereby deciding matching states between the test signals and the delayed test signals.

2. An integrated circuit for processing video signals comprising:

a first memory and a second memory each for delaying a digital video signal by one horizontal scanning period;

a test circuit for achieving a test of each of the first and second memories; and a plurality of input switching means wherein each input, switching means is connected to an input of said first and second memories and a plurality of output switching means wherein each output switching means is connected to an output of said first and second memories;

wherein the test circuit includes:

test signal generating means operative at a timing synchronized with a horizontal synchronizing signal of the digital video signal for producing an original test signal an a predetermined format represented by a series of a preset number of pulses in a predetermined duration period of time;

test signal distributor means operative in response to the original test signal supplied from the test signal generator means for generating a first test signal and a second test signal in a format substantially identical to that of the original test signal, the first and second test signals being respectively associated with the first and second memories and being produced respectively at a predetermined first point of time and at predetermined second point of time in the one horizontal scanning period; and collating means for collating the first test and second test signals respectively with a first delayed test signal and a second delayed test signal respectively created from the first and second memories in response to the first and second test signals respectively supplied thereto, thereby deciding matching states between the first test signal and the first delayed test signal and between the second test signal and the second delayed test signal.

3. An integrated circuit as claimed in claim 2, wherein the test signal distributor means is resettable by the horizontal synchronizing signal for a shift control by a clock signal associated with each pixel of the video signal so that the original test signal is delayable by a period of time from a leading edge of the original test signal to the first point of time, where the first test signal is produced, and from the first point of time to the second point of time, where the second test signal is produced.

4. An integrated circuit as claimed in claim 2, wherein the collating means includes:

a first counter circuit for counting a first period of time and a second period of time from a leading edge of the horizontal synchronizing signal respectively to leading edges respectively of the first and second test signals and first and second numbers of pulses in the format of the original test signal respectively related to the first and second periods of time, thereby respectively producing the first and second time values as well as the first and second numbers respectively of counted pulses;

a second counter circuit for counting a third period of time and a fourth period of time from a leading edge of the horizontal synchronizing signal respectively to leading edges respectively of the first and second delayed test signals and third and fourth numbers of pulses respectively related to the third and fourth periods of time, thereby respectively producing the third and fourth time values as well as the third and fourth numbers respectively of counted pulses; and a collating circuit for achieving collation between the first and third time values, between the second and fourth time values, between the first and third numbers of pulses, and between the second and fourth number of pulses, thereby determining matching conditions respectively therebetween.

5. An integrated circuit as claimed in claim 4, wherein the collating circuit supplies a normal signal therefrom as a monitor output signal if all are matched after the collation, and supplies an error signal therefrom as a monitor output signal if the result of collation is not matched.

6. An integrated circuit as claimed in claim 4, wherein the input and output switching means include a plurality of switches therein.

7. An integrated circuit as claimed in claim 4, the integrated circuit further comprising:

inputting circuit for supplying input video signals therefrom: and video signal processing means for digitizing the inputted video signals, and supplying the digitized video signals to the first and second memories.

8. A method of processing video signals comprising the steps of:

delaying a digital video signal by one horizontal scanning period; and testing the delayed digital video signal, said step of testing including the substeps of:

generating a test signal operative at a timing synchronized with a horizontal synchronizing signal of the digital video signal for producing an original test signal in a predetermined format represented by a series of a preset number of pulses in a predetermined duration period of time;

distributing the test signal operative in response to the original test signal supplied from the test signal generating step for generating a first test signal and a second test signal in a format substantially identical to that of the original test signal, the first and second test signals being produced respectively at a predetermined first point of time and at a predetermined second point of time in the one horizontal scanning period; and collating the first test and second test signals respectively with a first delayed test signal and a second delayed test signal in response to the first and second test signals, thereby deciding matching states between the first test signal and the second test signal with the first delayed test signal and the second delayed test signal.

\* \* \* \* \*